(12) United States Patent
Zipper

(10) Patent No.: US 7,245,897 B2
(45) Date of Patent: Jul. 17, 2007

(54) USING AN ELECTROACOUSTIC RESONATOR

(75) Inventor: Eliav Zipper, Tel-Aviv (IL)

(73) Assignee: Intel Corporation, Santa Clara, CA (US)

( * ) Notice: Subject to any disclaimer, the term of this patent is extended or adjusted under 35 U.S.C. 154(b) by 656 days.

(21) Appl. No.: 10/385,091

(22) Filed: Mar. 10, 2003

(65) Prior Publication Data

US 2004/0180640 A1   Sep. 16, 2004

(51) Int. Cl.
   *H04B 1/26* (2006.01)
(52) U.S. Cl. ........................ 455/324; 455/333
(58) Field of Classification Search ............ 455/196.1, 455/255, 197.3, 208, 258, 141, 146, 147, 455/256, 313, 73; 333/187; 331/107 A, 331/94.1; 375/316, 295, 261
See application file for complete search history.

(56) References Cited

U.S. PATENT DOCUMENTS

| | | | | |
|---|---|---|---|---|
| 5,355,524 A | * | 10/1994 | Higgins, Jr. ............... | 455/73 |
| 5,903,820 A | * | 5/1999 | Hagstrom ................... | 455/78 |
| 6,204,737 B1 | * | 3/2001 | Ella ............................ | 333/187 |
| 6,307,440 B1 | * | 10/2001 | Shimanuki .................. | 331/181 |
| 6,479,921 B2 | | 11/2002 | Ma et al. .................... | 310/309 |
| 6,724,804 B1 | * | 4/2004 | Kegasa et al. .............. | 375/295 |
| 6,744,829 B1 | * | 6/2004 | Mohindra ................... | 375/316 |
| 7,035,341 B2 | * | 4/2006 | Mohindra ................... | 375/261 |
| 2004/0137870 A1 | * | 7/2004 | Kivekas et al. ............. | 455/313 |
| 2004/0227578 A1 | * | 11/2004 | Hamalainen ............... | 331/107 A |

OTHER PUBLICATIONS

Lower-power GSM GPRS triple-band Near-Zero IF transceiver. Philips Semiconductors; Oct. 1999. www.semiconductors.philips.com.

* cited by examiner

*Primary Examiner*—Quochien B. Vuong
(74) *Attorney, Agent, or Firm*—Trop, Pruner & Hu, P.C.

(57) ABSTRACT

An apparatus in accordance with one embodiment of the present invention may include a local oscillator having an electroacoustic resonator; and zero intermediate frequency signal processing circuitry coupled to the local oscillator. In certain embodiments, the electroacoustic oscillator may be a thin film bulk acoustic resonator.

21 Claims, 2 Drawing Sheets

USING AN ELECTROACOUSTIC RESONATOR

BACKGROUND

The present invention is directed to resonators for oscillator circuits and more specifically to resonators for use in low radiation oscillators.

Zero intermediate frequency (ZIF) or very low intermediate frequency (IF) architecture is taking the place of heterodyne conversion architecture in many wireless applications. ZIF architecture provides low part count, simple frequency plan, and immunity to system noise (such as digital switching noise or spurious noise).

However, ZIF architecture has a major disadvantage, both in receive and transmit chains because the local oscillator (LO) frequency is very close to that of the signal on the antenna (both received and transmitted). Leakage of the LO in the receive case generates a direct current (DC) level in the receiver output. This DC level is not static, and requires increased dynamic range of an analog to digital converter or sophisticated cancellation techniques in some standards (such as Global System for Mobile Communications (GSM)). In the transmit case, the LO leakage may override the signal transmitted to the antenna (such as in wireless code division multiple access (W-CDMA) systems where transmit levels may reach down to −40 decibels (dBm)). In any transmit case, there may be a problem of LO pulling by the transmitted signal, due to radiation coupling.

While certain techniques are used to reduce these phenomena, certain drawbacks exist. Frequency division or multiplication is the most common technique, however this results in a higher current drain and circuit area and a limited noise floor. Other techniques utilize polar feedback to cope with transmitter effects, and cause the same current/area (and therefore cost) penalty.

Thus there is a need for a local oscillator with lower radiation to prevent leakage and pulling.

DETAILED DESCRIPTION

In various embodiments of the present invention, an electroacoustic resonator may be used in a local oscillator. In certain embodiments, such an electroacoustic resonator may avoid antenna-to-antenna coupling caused by using an electromagnetic resonator in the LO. The cause for such coupling between the antenna (or the devices that are attached to it such as the antenna switch or the transmit filter) and the LO is that the electromagnetic resonator is an LC (i.e., an inductor-capacitor) circuit. The inductor in such an electromagnetic resonator is actually a miniature antenna, and thus may couple to the antenna.

In certain embodiments, an electroacoustic resonator may be made from quartz, ceramic, or a surface acoustic wave (SAW) resonator, for example. In certain embodiments using such resonators, the resonator may be located off of a substrate supporting the LO.

In other embodiments, a thin film bulk acoustic resonator (F-BAR) may be used in a local oscillator. Such an F-BAR resonator may be made using conventional microelectromechanical systems (MEMS) manufacturing techniques. Further, in certain embodiments an F-BAR resonator may be incorporated in a wireless chip. For example, the F-BAR resonator may be mounted to the substrate of the LO and be housed within the same package as the LO (i.e., in the wireless chip). In other embodiments, the F-BAR resonator may be outside a wireless chip housing the LO.

Figure 1:
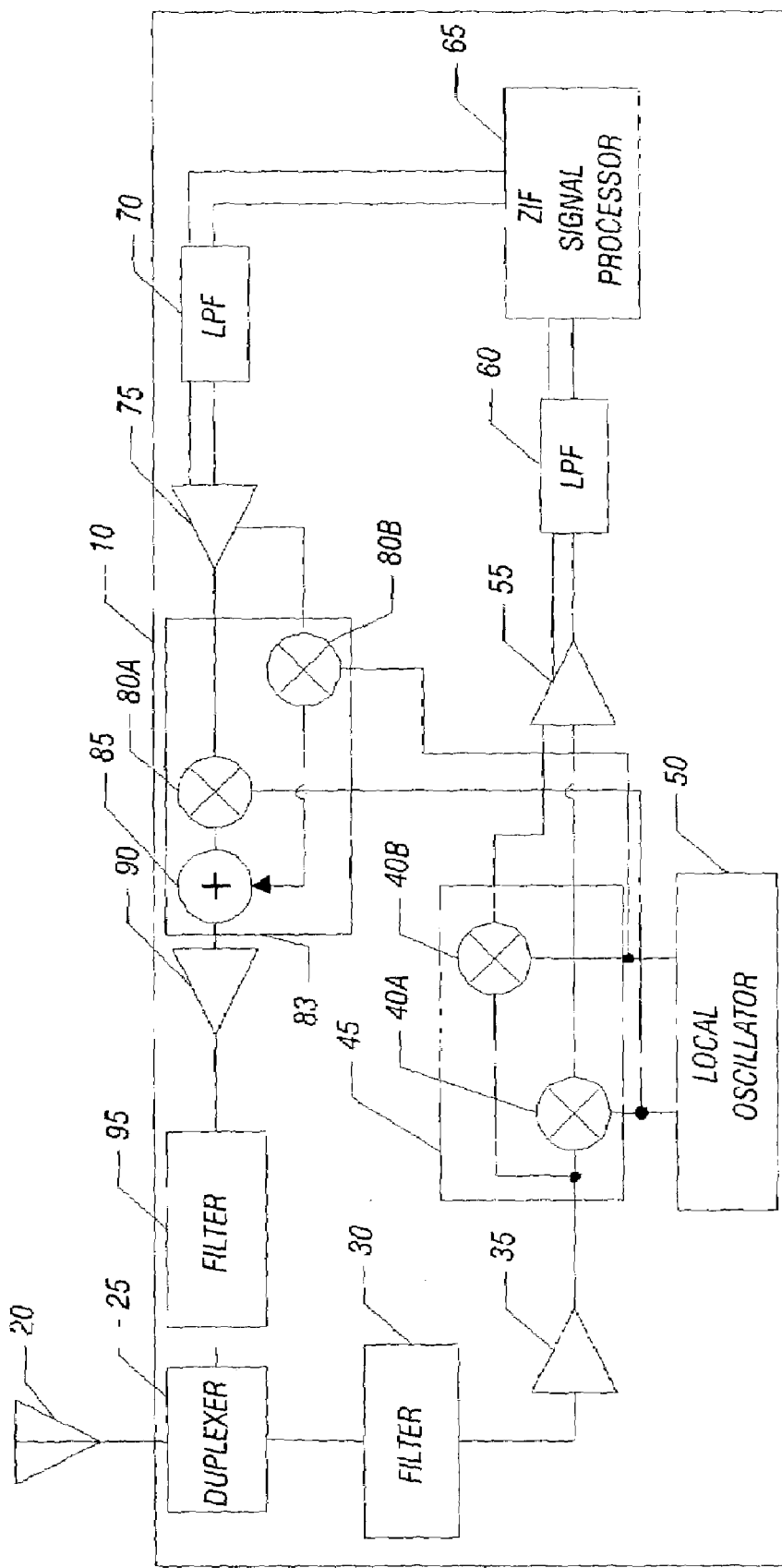
FIG. 1 is a block diagram of a wireless device in accordance with one embodiment of the present invention.

Referring now to FIG. 1, shown is block diagram of a wireless device 10 in accordance with one embodiment of the present invention. In various embodiments, wireless device 10 may be a wireless chip for use in a cellular telephone, personal digital assistant (PDA), notebook computer, and the like. In certain embodiments, wireless device 10 may incorporate zero intermediate frequency or near zero intermediate frequency architecture. As used herein, the terms "zero intermediate frequency" and "ZIF" refer to both zero intermediate frequency and near zero intermediate frequency architectures. As shown in FIG. 1, an antenna 20 may be coupled to wireless device 10 to receive and transmit radio frequency (RF) signals. In various embodiments, antenna 20 may be a dipole, helical antenna, a mobile or short antenna, or the like. Antenna 20 may be coupled to a duplexer 25, which is operable to select between transmit and receive paths. While shown within wireless device 10, in other embodiments duplexer 25 may be located outside device 10. More so, in other embodiments, an antenna switch may be used to select between transmit and receive paths instead of a duplexer.

Following the receive signal path, antenna 20 may be coupled through duplexer 25 to a filter 30 and an amplifier 35, in one embodiment. After such filtering and amplification, the incoming signal may be mixed via a complex (IQ) mixer 45 with outputs of a local oscillator 50. As shown in the embodiment of FIG. 1, complex mixer 45 may provide in phase (I) (i.e., real) and quadrature phase (Q) (i.e., imaginary) signals using mixers 40A and 40B, respectively. In such manner, mixer 40A down-converts the filtered and amplified signal into a real baseband signal by demodulating with a cosine local signal from local oscillator 50, while mixer 40B down-converts the filtered and amplified signal into an imaginary baseband signal by demodulating with a sine local signal from local oscillator 50.

In certain embodiments, local oscillator 50 may be operated at a frequency substantially identical to the frequency of incoming signals. In such manner, complex mixer 45 may convert incoming signals to zero intermediate frequency signals. In the embodiment of FIG. 1, the I and Q down-mixed signals may be sent to an amplifier 55 and a low pass filter 60. The filtered signals may then pass to a ZIF signal processor 65. In certain embodiments, the ZIF signal processor 65 may perform desired signal processing on received filtered signals. While not shown in FIG. 1, ZIF signal processor 65 may be coupled to other circuits or devices as desired to provide and receive signals for further processing and use.

FIG. 1 also details a signal flow from ZIF signal processor 65 to transmit antenna 20. As shown in FIG. 1, I and Q zero intermediate frequency signals may be output from ZIF signal processor 65 and pass through a low pass filter 70 and an amplifier 75. Such filtered and amplified I and Q signals may then be mixed in complex mixer 83 with cosine and sine outputs of local oscillator 50 (via mixers 80A and 80B, respectively) to up-convert the signals to the desired frequency for transmission. The up-converted signals may then be combined via adder 85. The resulting signal may then be amplified by amplifier 90 and filtered via filter 95 prior to passing through duplexer 25 and being transmitted via antenna 20, in certain embodiments.

While wireless device 10 shown in FIG. 1 is an integrated device in which all components are housed in a single package, in other embodiments one or more components may be located separately. For example certain components within wireless device 10 may be located in separate ones of a wireless chipset. Also in certain embodiments all of the components shown in FIG. 1 need not be present, and other components may be present in other embodiments.

In embodiments of the present invention, it may be desirable to avoid antenna coupling between antenna 20 and local oscillator 50. As discussed above, an LC circuit used in local oscillator 50 may cause such antenna to antenna coupling to occur. Thus in embodiments of the present invention, an electroacoustic resonator may be used in local oscillator 50 in place of an LC circuit.

Figure 2:
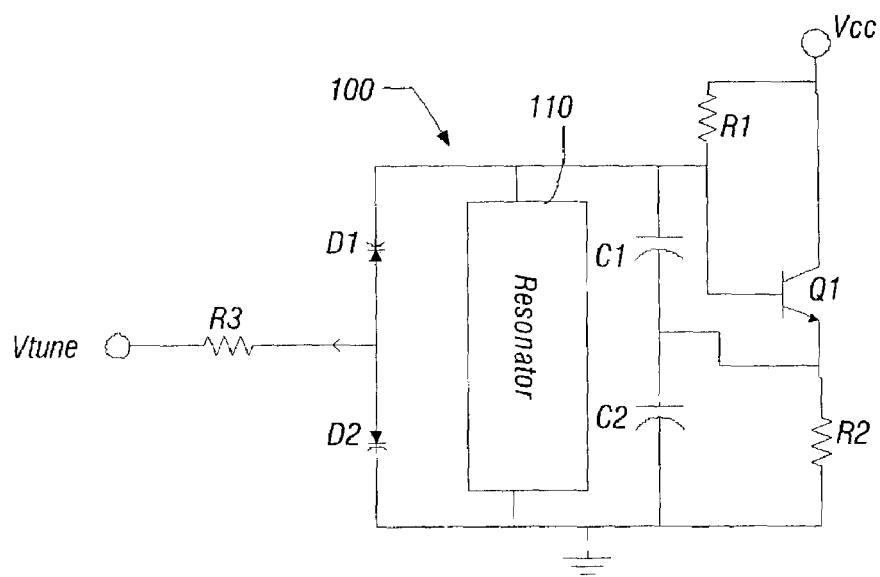
FIG. 2 is a schematic diagram of a local oscillator in accordance with one embodiment of the present invention.

Referring now to FIG. 2, shown is a schematic diagram of a local oscillator in accordance with one embodiment of the present invention. As shown in FIG. 2, local oscillator 100 may be based on a conventional local oscillator circuit, such as a Colpitts oscillator; however, the LC circuit may be replaced with an electroacoustic resonator 110. By use of an electroacoustic resonator, an oscillator in accordance with an embodiment of the present invention may avoid coupling with an associated antenna.

As shown in FIG. 2, in one embodiment, local oscillator 100 may include a bipolar transistor Q1 having a resistor R1 coupled between the collector and base. In certain embodiments, R1 may have a value of between 0 and 1000 Ohm. A second resistor R2, which in certain embodiments may be between 10 and 500 Ohm, may be coupled to the emitter of transistor Q1. More so, a capacitor network having capacitors C1 and C2 may be coupled as shown in FIG. 2. In one embodiment, capacitors C1 and C2 may have values of between 0.5 and 50 picoFarads (pF), depending upon frequency and resonator characteristics. Coupled in parallel with the capacitor network may be electroacoustic resonator 110.

As discussed above, in various embodiments electroacoustic resonator 110 may be a quartz, ceramic, SAW, or F-BAR resonator. Also coupled in parallel may be a varactor network having first varactor D1 and a second varactor D2. The node connecting the varactors may be coupled to a resistor R3, which may have values between 10 and 100 kiloOhm (kOhm), in certain embodiments. A voltage $V_{tune}$ may tune local oscillator 100 to a desired frequency, in certain embodiments.

In certain embodiments, local oscillator 100 may operate such that it oscillates at a frequency substantially identical to a frequency of an antenna to which it is coupled. As such, local oscillator 100 may appropriately be mixed with RF signals received from the antenna to obtain zero or near zero intermediate frequency signals for processing. Similarly, local oscillator 100 may be mixed with baseband signals to upconvert them to a desired radio frequency for transmission.

Figure 3:
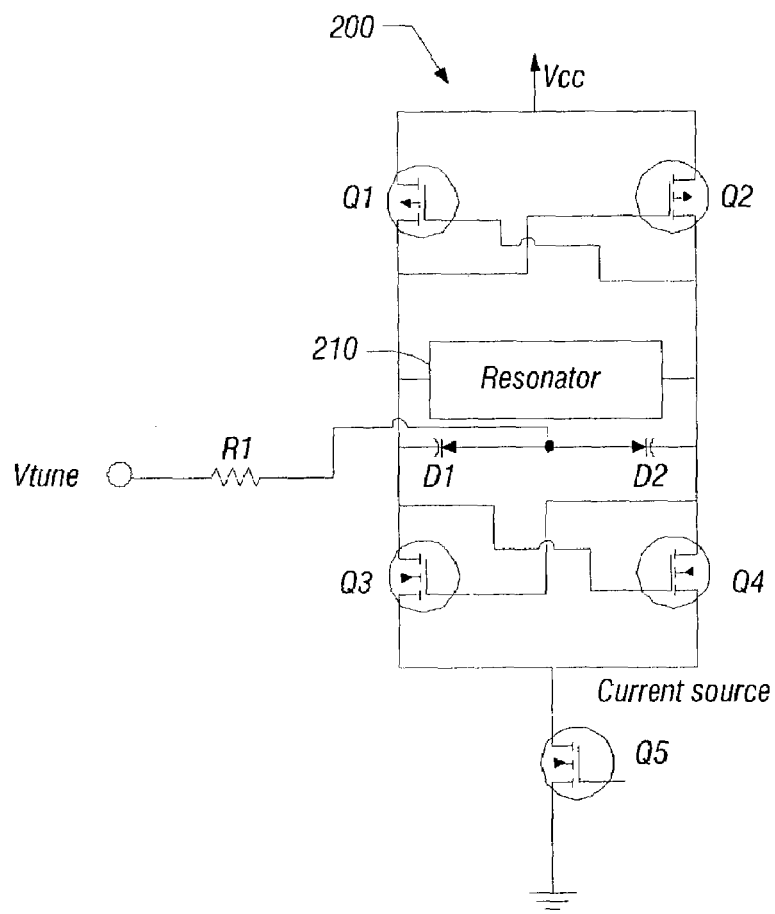
FIG. 3 is a schematic diagram of a local oscillator in accordance with a second embodiment of the present invention.

Referring now to FIG. 3, shown is a schematic diagram of a local oscillator in accordance with a second embodiment of the present invention. As shown in FIG. 3, local oscillator 200 includes complementary metal oxide semiconductor (CMOS) transistors Q1-Q5, and may generally take the form of a dual CMOS inverter structure. As shown in the embodiment of FIG. 3, the top two transistors Q1 and Q2 are P-channel CMOS devices and may be coupled between $V_{cc}$ and electroacoustic resonator 210. In parallel with electroacoustic resonator 210 may be coupled varactors D1 and D2. Transistors Q3 and Q4 may be coupled between varactors D1 and D2 and transistor Q5, which provides a current source, as shown in the embodiment of FIG. 3.

A resistor R1 may be coupled to a node coupling varactors D1 and D2, and in certain embodiments may be a 10 to 100 kOhm resistor. Voltage $V_{tune}$ may tune oscillator 200 to a desired frequency, in certain embodiments. As discussed above regarding the local oscillator of FIG. 2, certain embodiments of the oscillator of FIG. 3 may be used to provide a frequency substantially identical to that of an associated antenna.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a local oscillator having an electroacoustic resonator coupled in parallel between a capacitor network and a varactor network, wherein the electroacoustic resonator is mounted on a substrate including the local oscillator;
   zero intermediate frequency signal processing circuitry coupled to the local oscillator; and
   a complex mixer coupled between the local oscillator and the zero intermediate frequency signal processing circuitry.

2. The apparatus of claim 1, further comprising an antenna coupled to provide a radio frequency signal to the complex mixer.

3. The apparatus of claim 2, wherein the local oscillator includes at least one output having a frequency substantially identical to that of the radio frequency signal.

4. The apparatus of claim 1, wherein the electroacoustic resonator comprises a bulk acoustic resonator.

5. The apparatus of claim 1, wherein the local oscillator and the zero intermediate frequency signal processing circuitry are housed together in a package.

6. The apparatus of claim 1, wherein the electroacoustic resonator is used in place of an electromagnetic resonator.

7. The apparatus of claim 1, further comprising a second complex mixer coupled between the local oscillator and the zero intermediate frequency signal processing circuitry.

8. The apparatus of claim 7, wherein the second complex mixer is to receive a baseband signal and to generate a transmission radio frequency signal.

9. The apparatus of claim 1, wherein the local oscillator includes a first resistor coupled between a collector of a transistor and a base of the transistor.

10. The apparatus of claim 9, wherein an emitter of the transistor is coupled to a second resistor.

11. An apparatus comprising:
    an antenna;
    a local oscillator having an electroacoustic resonator coupled to a first complementary metal oxide semiconductor (CMOS) inverter, a second CMOS inverter, and a varactor network, wherein the electroacoustic resonator is mounted on a substrate including the local oscillator;
    a first complex mixer coupled to receive at least one local signal from the local oscillator and to receive a first radio frequency signal from the antenna, the at least one local signal to have a frequency substantially identical to the frequency of the first radio frequency signal;

zero intermediate frequency processing circuitry coupled to receive a zero intermediate frequency signal from the first complex mixer; and a second complex mixer coupled between the local oscillator and the zero intermediate processing circuitry, the second complex mixer to mix a processed signal from the zero intermediate processing circuitry with the at least one local signal to generate a second radio frequency signal for transmission.

12. The apparatus of claim 11, wherein the electroacoustic resonator comprises a bulk acoustic resonator.

13. The apparatus of claim 11, wherein the local oscillator is to generate an output at a frequency substantially identical to that of the radio frequency signal.

14. The apparatus of claim 11, wherein the electroacoustic resonator is to be used in place of an electromagnetic resonator.

15. The apparatus of claim 11, wherein the first CMOS inverter is coupled to an additional transistor, the additional transistor to provide a current source.

16. A method comprising:
using an acoustic resonator to generate a local signal, the acoustic resonator coupled to a first CMOS inverter and a second CMOS inverter;
mixing a radio frequency signal with the local signal, generated using the electroacoustic resonator to obtain a zero intermediate frequency signal; and
processing the zero intermediate frequency signal.

17. The method of claim 16, further comprising receiving the radio frequency signal with an antenna.

18. The method of claim 16, further comprising reducing electromagnetic radiation of the local oscillator using the electroacoustic resonator.

19. The method of claim 16, further comprising reducing antenna coupling by using the electroacoustic resonator.

20. The method of claim 16, further comprising mixing a processed zero intermediate frequency signal with the local signal to generate a second radio frequency signal for transmission.

21. The method of claim 16, further comprising coupling the first CMOS inverter to an additional transistor, the additional transistor to provide a current source.

* * * * *